(12) United States Patent
Stoffels et al.

(10) Patent No.: US 11,114,537 B2
(45) Date of Patent: Sep. 7, 2021

(54) ENHANCEMENT-MODE HIGH ELECTRON MOBILITY TRANSISTOR

(71) Applicant: IMEC VZW, Leuven (BE)

(72) Inventors: Steve Stoffels, Haasrode (BE); Niels Posthuma, Elewijt (BE); Brice De Jaeger, Heverlee (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/748,192

(22) Filed: Jan. 21, 2020

(65) Prior Publication Data
US 2020/0235218 A1 Jul. 23, 2020

(30) Foreign Application Priority Data

Jan. 23, 2019 (EP) .................................... 19153176

(51) Int. Cl.
*H01L 29/47* (2006.01)
*H01L 29/20* (2006.01)
(Continued)

(52) U.S. Cl.
CPC ...... *H01L 29/475* (2013.01); *H01L 21/28581* (2013.01); *H01L 21/32134* (2013.01);
(Continued)

(58) Field of Classification Search
CPC . H01L 29/475; H01L 29/2003; H01L 29/205; H01L 29/66462; H01L 29/7786
See application file for complete search history.

(56) References Cited

U.S. PATENT DOCUMENTS 7,816,707 B2 10/2010 Hikita et al.
9,748,347 B2 8/2017 Cao et al.
(Continued)

FOREIGN PATENT DOCUMENTS

CN 107180759 9/2017

OTHER PUBLICATIONS

Posthuma, N. E., You, S., Stoffels, S., Liang, H., Zhao, M., & Decoutere, S. (May 2018). Gate architecture design for enhancement mode p-GaN gate HEMTs for 200 and 650V applications. In 2018 IEEE 30th International Symposium on Power Semiconductor Devices and ICs (ISPSD) (pp. 188-191). IEEE.
(Continued)

*Primary Examiner* — Mark W Tornow
(74) *Attorney, Agent, or Firm* — McDonnell Boehnen Hulbert & Berghoff LLP (57) ABSTRACT

Example embodiments relate to enhancement-mode high electron mobility transistors. One embodiment includes a method for manufacturing an enhancement-mode high electron mobility transistor. The method includes providing a stack of layers. The stack of layers includes a substrate, a III-V channel layer over the substrate, a III-V barrier layer on the channel layer, a p-doped III-V layer on the III-V barrier layer, and a Schottky contact interlayer on the p-doped III-V layer. The p-doped III-V layer has a first surface area. The Schottky contact interlayer has a second surface area. The second surface area is less than the first surface area. The second surface area leaves a peripheral part of a top surface of the p-doped III-V layer uncovered. The method also includes depositing a metal gate on the Schottky contact interlayer.

20 Claims, 5 Drawing Sheets

(51) Int. Cl.
    *H01L 29/205*     (2006.01)
    *H01L 29/66*     (2006.01)
    *H01L 29/778*     (2006.01)
    *H01L 21/285*     (2006.01)
    *H01L 21/3213*     (2006.01)

(52) U.S. Cl.
    CPC .... *H01L 21/32139* (2013.01); *H01L 29/2003* (2013.01); *H01L 29/205* (2013.01); *H01L 29/66462* (2013.01); *H01L 29/7786* (2013.01)

(56) References Cited

U.S. PATENT DOCUMENTS

| | | |
|---|---|---|
| 2012/0299060 A1 | 11/2012 | Kohda et al. |
| 2017/0133500 A1 | 5/2017 | Etou et al. |
| 2017/0179272 A1 | 6/2017 | You et al. |
| 2017/0317179 A1* | 11/2017 | Cao .................. H01L 29/42316 |
| 2017/0358495 A1 | 12/2017 | Jiang |
| 2018/0218910 A1* | 8/2018 | Harada ............... H01L 29/0684 |
| 2020/0176595 A1* | 6/2020 | Otake .................. H01L 29/475 |

OTHER PUBLICATIONS

Hwang, Injun, Jongseob Kim, Hyuk Soon Choi, Hyoji Choi, Jaewon Lee, Kyung Yeon Kim, Jong-Bong Park et al. "p-GaN gate HEMTs with tungsten gate metal for high threshold voltage and low gate current." IEEE electron device letters 34, No. 2 (2013): 202-204.

Harada, T., Utaka, K., Kanda, Y., Onishi, K., Matsunaga, K., Hikita, M. and Uemoto, Y., Jun. 2018. Single Crystal Al Interconnects Formed on p-GaN and Their Application to GaN FET. In 2018 IEEE International Interconnect Technology Conference (IITC) (pp. 22-24). IEEE.

European Search Report, European Patent Application No. 19153176. 3, dated Jul. 26, 2019, 8 pages.

Posthuma, N. E., S. You, S. Stoffels, D. Wellekens, H. Liang, M. Zhao, B. De Jaeger et al. "An industry-ready 200 mm p-GaN E-mode GaN-on-Si power technology." In 2018 IEEE 30th International Symposium on Power Semiconductor Devices and ICs (ISPSD), pp. 284-287. IEEE, 2018.

* cited by examiner

ENHANCEMENT-MODE HIGH ELECTRON MOBILITY TRANSISTOR

CROSS-REFERENCE TO RELATED APPLICATIONS

The present application is a non-provisional patent application claiming priority to European Patent Application No. EP 19153176.3, filed Jan. 23, 2019, the contents of which are hereby incorporated by reference.

FIELD OF THE DISCLOSURE

The present disclosure relates to the field of enhancement-mode high electron mobility transistors (EM-HEMT) and to a method for producing such a transistor.

BACKGROUND

Semiconductor devices based on a III-V channel layer such as gallium nitride (GaN) can support high voltages and carry a large current. This makes them promising candidates for power semiconductor devices aimed at high power/high-frequency applications. Devices manufactured for such applications exhibit high electron mobility and are referred to as high electron mobility transistors (HEMT), heterojunction field effect transistors (HFET), or modulation doped field effect transistors (MODFET). These types of devices can typically withstand high voltages, e.g., 100 Volts.

GaN HEMT devices typically include an AlGaN barrier layer adjacent to a GaN layer. The difference in the material in these two layers contributes to a conductive two-dimensional electron gas (2DEG) region near the junction of the two layers and in the layer with the smaller band gap. This 2DEG allows charge to flow through the device. Such devices are typically normally-on devices. In circuits, normally-off power components, also called enhancement mode (e-mode) transistors, may be used for fail-safe operation. To realize e-mode transistors, the gate region may be adapted to fully switch off the transistor at a gate voltage of 0 V One of the approaches to obtain this is to use a p-doped III-V gate, such as a Mg-doped p-type GaN (p-GaN) gate, lifting the conduction band in the channel at equilibrium, therefore realizing e-mode operation.

A potential disadvantage of this is that the p-GaN gate is a junction type of gate and can thus cause high gate leakage. A possible technique to lower the gate leakage is to employ a gate metal, which can form a Schottky contact towards the p-GaN. One example of such a metal is TiN. However, the leakage of the Schottky metal may be determined, at least in part, by the active Mg concentration in the p-GaN layer, where a higher concentration leads to a higher gate leakage. This causes a trade-off between the threshold voltage and gate leakage because to achieve a high threshold voltage, a high active Mg concentration may be used. However, this also leads to increased leakage.

N. E. Posthuma et al. (IEEE 30th International Symposium on Power Semiconductor Devices and ICs, 2018, Page(s): 284-287) disclose an Enhancement mode 650V rated p-GaN gate HEMT fabricated on a 200 mm p$^+$ Si substrate by using an industrial, Au-free process. This device showed true e-mode performance, with a high $V_t$ of 2.8 V, and a relatively low off-state leakage current.

However, the present disclosure describes that when a forward gate bias is applied, a sudden increase in gate leakage occurs at gate bias values which are much below the expected breakdown values of the gate. This is unwanted as one wants to assure a long lifetime of the device.

There is therefore a need for improved EM-HEMT and for methods to manufacturing the same.

SUMMARY

The present disclosure provides EM-HEMTs or methods for manufacturing the same.

Embodiments may provide high reliability, even when the device is operated at relatively high voltages.

Embodiments may include a minimal amount of etching and, therefore, may reduce waste.

Embodiments may only cause minimal damage or no damage at all to the p-doped III-V gate layer.

Embodiments may not require the etching of multiple different metal gate layers.

Embodiments may include a limited number of steps.

Embodiments may be compatible with providing a gate metal of low sheet resistance, thereby enabling high switching speed and low temperature of the device during switching.

The above is accomplished by a method and device according to the present disclosure.

In a first aspect, the present disclosure relates to a process for manufacturing an enhancement-mode high electron mobility transistor, comprising the steps of:

a. Providing a stack of layers comprising a substrate, a III-V channel layer over the substrate, a III-V barrier layer on the channel layer, and a p-doped III-V layer on the III-V barrier layer, the p-doped III-V layer having a first surface area, a Schottky contact interlayer on the p-doped III-V layer, the Schottky contact interlayer having a second surface area, smaller than the first surface area, and leaving a peripheral part of the top surface of the p-doped III-V layer uncovered, and b. Depositing a metal gate on the schottky contact interlayer.

The present disclosure describes that when a forward gate bias is applied to standardized III-V power devices, the p-doped III-V layer in the device is subject to electrical fields which can cause degradation of the component. This is unwanted as one wants to assure a long lifetime of the device. Under forward operation the reliability of the p-doped III-V gate can be limited by several mechanisms.

a) Degradation in the depletion region around the contact due to avalanching, b) III-V Barrier degradation due to defect creation, and/or c) Degradation at the gate perimeter (sidewall of the gate).

The present disclosure aims to address degradation mechanism (c), to reduce or eliminate the degradation occurring at the sidewall of the gate. The present disclosure describes that when a positive gate bias is applied, a sudden increase in gate leakage occurs at gate bias values which are much below the expected breakdown values of the gate. This is visible in the plain line of FIG. 1. Without being bound by theory, it is believed to occur due to an activation of a sidewall leakage path, which forms due to a potential difference between the p-doped III-V layer and the contact on the top side of the p-doped III-V layer gate. A sidewall leakage path has also been physically measured with Electron Beam Induced Current (EBIC) imaging. The increased carrier concentration (or carrier injection) along the sidewall of the gate is believed to cause degradation of the dielectric passivating the sidewall and leads to eventual device failure.

The issue is that under high forward gate bias the sidewall leakage path forms and this creates a conductive path connecting the channel (2DEG) to the contact on top of the p-GaN gate (therefore the increase in leakage current).

In order to improve the reliability of the device, the present disclosure envisions interrupting the sidewall leakage path. One possible remedy would be to etch a peripheral portion of the complete metal gate stack after it has been formed. This would expose the top surface of a corresponding peripheral portion of the p-doped III-V layer. Such a technique may be problematic for several reasons, though. First, it represents a waste of metal gate material since the whole height of the gate stack would be etched while, in principle, only the removal of a bottom portion thereof should suffice to achieve the wished purpose. Second, etching through a variety of materials may include either a very aggressive etching method, susceptible to damage the p-doped III-V layer, or the use of a plurality of etching methods, which leads to a very complex process. This last problem could in turn be solved by using, instead of a multilayer metal gate stack, a single Schottky metal layer (e.g. a single TiN layer). However, this does not solve the problem of having to etch the whole thickness of the metal gate and this creates the additional problem that Schottky metals, such as TiN, have a sheet resistance which is much higher than the sheet resistance of ohmic metals such as Al. This would result in a low switching speed and a high temperature of the device during switching.

As a result of all these considerations, the present disclosure includes a process where a Schottky contact interlayer, having a smaller surface than the p-doped III-V layer, is formed on the p-doped III-V layer, so as to leave a peripheral portion of the p-doped III-V layer uncovered (by the Schottky contact layer). This method exposes a top surface of the peripheral portion of the p-doped III-V layer. Only after the Schottky contact interlayer has been formed, is a metal gate deposited thereon. This technique may be efficient in terms of device lifetime extension and may show none of the drawbacks envisioned for the other alternative techniques discussed above.

By having a peripheral portion of the top of the p-doped III-V layer not covered by a conductive material, the leakage path is interrupted and a direct flow of charge carriers from the channel to the top metal is no longer possible.

In a second aspect, the present disclosure relates to an enhancement-mode high electron mobility transistor comprising a stack of layers comprising a substrate, a III-V channel layer over the substrate, a III-V barrier layer on the channel layer, a p-doped III-V layer on the III-V barrier layer, the p-doped III-V layer having a first surface area, a Schottky contact interlayer on the p-doped III-V layer, the Schottky contact interlayer having a second surface area, smaller than the first contact area, and leaving a peripheral part of the top surface of the p-doped III-V layer uncovered, and a metal gate on the Schottky contact interlayer.

Particular aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change, and evolution of devices in this field, the present concepts are believed to represent substantial new and novel improvements, including departures from prior practices, resulting in the provision of more efficient, stable, and reliable devices of this nature.

The above and other characteristics and features will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

In the different figures, the same reference signs refer to the same or analogous elements.

DETAILED DESCRIPTION

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice.

Furthermore, the terms first, second, third, and the like in the description and in the claims, are used for distinguishing between similar elements and not necessarily for describing a sequence, either temporally, spatially, in ranking, or in any other manner. It is to be understood that the terms so used are interchangeable under appropriate circumstances and that the embodiments described herein are capable of operation in other sequences than described or illustrated herein.

Moreover, the terms top, bottom, over, under, and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising", used in the claims, should not be interpreted as being restricted to the features listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising A and B" should not be interpreted as being limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent from this disclosure, in one or more embodiments.

Similarly, it should be appreciated that in the description of example embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures, and techniques have not been shown in detail in order not to obscure an understanding of this description.

The following terms are provided solely to aid in the understanding of the disclosure.

Reference will be made to transistors. These are three-terminal devices having a first main electrode such as a drain, a second main electrode such as a source and a control electrode such as a gate for controlling the flow of electrical charges between the first and second main electrodes.

Unless provided otherwise, when the p-doped III-V layer is said to have a first surface area, it is the surface area of its top surface, i.e. its surface touching the Schottky contact interlayer, which has the first surface area. This precision is typically not necessary because the top and the bottom layer of the p-doped III-V layer typically have comparable surface area.

Unless provided otherwise, when the Schottky contact interlayer is said to have a second surface area, it is the surface area of its bottom surface, i.e. its surface touching the p-doped III-V layer, which has the second surface area. This precision is typically not necessary because the top and the bottom layer of the Schottky contact interlayer typically have comparable surface area.

In a first aspect, the present disclosure relates to a process for manufacturing an enhancement-mode high electron mobility transistor, comprising the steps of: a. Providing a stack of layers comprising a substrate, a III-V channel layer over the substrate, a III-V barrier layer on the channel layer, and a p-doped III-V layer on the III-V barrier layer, the p-doped III-V layer having a first surface area, a Schottky contact interlayer on the p-doped III-V layer, the Schottky contact interlayer having a second surface area, smaller than the first surface area, and leaving a peripheral part of the top surface of the p-doped III-V layer uncovered, and b. Depositing a metal gate on the Schottky contact interlayer.

The substrate is typically a semiconductor substrate such a group IV or group III-V substrate. It is most typically a group IV substrate. In some embodiments, a substrate is a Si monocrystalline substrate. In some embodiments, the stack of layers is provided on a (111) surface of a Si monocrystalline substrate.

Between the substrate and the channel layer, a so-called buffer layer may be present. The buffer layer can play a variety of roles. It can control the wafer warp, assist in sustaining high voltages, compensate for the difference in lattice parameter between the substrate and the channel layer, amongst others. The buffer layer can be a standardized buffer layer. It typically comprises a plurality of layers. For instance, it may comprise a nucleation layer grown on the substrate. The nucleation layer may be a standardized nucleation layer. For instance, an AlN layer can be used. The buffer layer may further comprise a stress-compensation layer, typically present on the nucleation layer. It is typically a nitride comprising aluminum, gallium, or a combination of both. The stress-compensation layer may for instance be a superlattice, stack of different superlattices, or any other layer to perform stress management in the buffer. The buffer layer may further comprise a back barrier layer. The back barrier layer may be a standardized back barrier layer. The back barrier layer is typically a nitride of Al, Ga, In, or a combination thereof. When a back barrier is present, the III-V channel layer may be grown thereon.

The III-V channel layer is where the 2DEG will be formed. The III-V channel layer may be a nitride of formula $Al_{x'}Ga_{y'}In_{z'}N$. It is typically epitaxially grown by chemical vapor deposition, on the substrate or on the buffer layer if present (e.g. on the back barrier layer). In the $Al_{x'}Ga_{y'}In_{z'}N$ channel layer, the sum of x', y', and z' amount to 1. In some embodiments, y' amounts to at least 0.5. In some embodiments, y' amounts to at least 0.8. In some embodiments, y' amounts to at least 0.9. In some embodiments, y' equals 1. In some embodiments, the channel layer may be made of GaN.

The average Mg concentration in the channel layer may be less than $0.5 \times 10^{19}$, e.g., less than $1 \times 10^{18}$ atoms/cm$^3$. In typical embodiments, the $Al_{x'}Ga_{y'}In_{z'}N$ channel layer is not doped.

Also, a III-V barrier layer is present on the III-V channel layer. This is the layer that will induce the 2DEG in the channel layer. Without being bound by theory, it is believed to be due to differences in spontaneous & piezoelectric polarization. The III-V barrier layer is typically of formula $Al_{x''}Ga_{y''}In_{z''}N$, wherein x"+y"+z" is 1. It is also typically formed by chemical vapor deposition.

The barrier layer is typically a layer having a larger band gap than the channel layer. To achieve this, x" is typically larger than x'. In a typical embodiment, the channel layer can be GaN and the barrier layer may be $Al_{0.25}Ga_{0.75}N$.

The p-doped III-V layer is typically of a p-doped $Al_xGa_yIn_zN$ gate layer. The p-doped $Al_xGa_yIn_zN$ gate layer is typically an $Al_xGa_yIn_zN$ layer doped with Mg. Forming the p-doped $Al_xGa_yIn_zN$ gate layer is typically performed by chemical vapor deposition (CVD) and more precisely by metal organic chemical vapor deposition (MOCVD), i.e. a CVD method involving the use of one or more metalorganic precursors.

Typically, all steps involving flowing a precursor gas are performed in presence of a carrier gas, e.g., a reductive gas mixture such as an $N_2/H_2$ gas mixture.

In the p-doped $Al_xGa_yIn_zN$ gate layer, the sum of x, y, and z amount to 1. In some embodiments, y amounts to at least 0.5. In some embodiments, y amounts to at least 0.8. In some embodiments, y amounts to at least 0.9. In some embodiments, y equals 1.

A typical embodiment of the present disclosure makes use of a GaN channel, an $Al_{x'}Ga_{y'}In_{z'}N$ layer thereon wherein 0.5>x>0 and z is 0, and a Mg-doped GaN thereon.

The p-doped III-V layer has a first surface area.

The stack of layer provided in step a comprises a Schottky contact interlayer on the p-doped III-V layer, the Schottky contact interlayer having a second surface area, smaller than the first surface area. The Schottky contact interlayer leaves a peripheral part of the top surface of the p-doped III-V layer uncovered.

The Schottky contact interlayer can for instance be made of W, Pd, Pt, TiN, or a combination thereof (e.g. a stack of two or more layers independently selected from W, Pd, Pt, and TiN). In some embodiments, the Schottky contact interlayer is made of W, TiN, or a combination thereof (e.g. a stack of two or more layers independently selected from W, TiN). In some embodiments, the Schottky contact interlayer is a single TiN layer.

In embodiments, the Schottky contact interlayer (e.g. a TiN layer) may have a thickness of from 1 to 50 nm, e.g. from 2 nm to 40 nm, e.g. from 3 nm to 35 nm. For instance, the thickness of the Schottky contact interlayer may be from 25 to 35 nm.

The Schottky contact interlayer may for instance be formed on the p-doped III-V material by Physical Vapor Deposition (PVD).

The Schottky contact interlayer having a second surface area, smaller than the first surface area, and leaving a peripheral part of the top surface of the p-doped III-V layer uncovered, can be formed in several ways. Three alternatives will be presented here. In the first alternative, step a comprises the steps of:
i. Providing a stack of layers comprising the substrate, the III-V channel layer over the substrate, the III-V barrier layer on the channel layer, the p-doped III-V layer on the III-V barrier layer, a Schottky contact interlayer of surface area larger than the second surface area on the p-doped III-V layer, and a hard mask on the Schottky contact interlayer,
ii. Laterally etching part of the Schottky contact interlayer by a wet etch process, thereby forming:
the Schottky contact interlayer having the second surface area, and
a gap between the p-doped III-V layer and the hard mask, and
iii. Removing at least part of the hard mask, thereby exposing at least part of the Schottky contact interlayer.

The Schottky contact interlayer provided in step i is as described before in terms of chemical nature and thickness. Its surface area is for instance equal to the surface area of the p-doped layer, i.e. to the first surface area.

The hard mask can be any suitable hard mask. For instance, it can be a SiN hard mask. The hard mask can for instance be provided by Plasma-Enhanced Chemical Vapor Deposition (PECVD).

Step ii of laterally etching part of the Schottky contact interlayer by a wet etch process is performed by using a wet etchant suitable for selectively etching the Schottky contact interlayer with respect to the hard mask and the p-doped III-V layer. The use of a wet etchant may be less prone to damage the p-doped III-V layer. In the case of the Schottky contact interlayer being a TiN interlayer, step iii can be performed with a Sulfuric Peroxide Mixture (SPM, i.e. a sulfuric acid-hydrogen peroxide mixture), an ammonia-peroxide-water mixture (APM, i.e. a mixture of ammonia, hydrogen peroxide, and water), or a succession of etching steps, each successive step using an etchant independently selected from SPM, and APM. For instance, SPM can be used first, then APM. Particularly good results may be obtained using only two etching steps: an SPM step and an APM step. In some embodiments, the SPM step is performed before the APM step. Independently of whether the SPM step is the only lateral etching step performed or whether the SPM step is combined to an APM step, the SPM step may be performed with SPM having a volume ratio sulfuric acid to hydrogen peroxide of from 1:5 to 1:20, e.g. 1:8 to 1:12 (e.g. 1:10). Independently of whether the SPM step is the only lateral etching step performed or whether the SPM step is combined to an APM step, the SPM step may be performed for from 0.5 to 30 min, from 1 to 20 min, or from 1 to 6 min. In some embodiments, the SPM step maybe performed at a temperature of from 80 to 99° C. or from 85 to 95° C. In some embodiments, the APM step is performed with APM with a volume ratio ammonia:hydrogen of from 1:3 to 1:5. In some embodiments, the APM step is performed with APM with a volume ratio ammonia:water of 1:10 to 1:30. In some embodiments, the APM step is performed with APM with a volume ratio hydrogen peroxide:water of 1:10 to 3:10.

In some embodiments, the APM step is performed with APM with a volume ratio ammonia:hydrogen peroxide:water of 1:4:20. In some embodiments, the APM step is performed for from 0.5 to 30 min, from 1 to 10 min, or from 1 to 6 min. In some embodiments, the APM step is performed at a temperature of from 50 to 80° C., from 55 to 75° C., or from 60 to 70° C. In some embodiments, when the Schottky interlayer is TiN, step iii comprises an etching step with SPM (1:10) for 5 minutes at 90° C., followed by an etching step with APM (1:4:20) for 5 minutes at 65° C.

In embodiments, step a may further comprise a step, e.g. between step (i) and step (ii), of exposing the sidewalls of the p-doped III-V layer to tetramethylammonium hydroxide (TMAH). This may straighten the sidewalls of the p-doped III-V layer, e.g. when the p-doped III-V layer is a p-GaN layer.

Step ii may be performed until a peripheral part of the top surface of the p-doped III-V layer is uncovered, where the peripheral part has a width (w) of from 10 to 500 nm, from 20 to 300 nm, from 30 to 250 nm, or from 35 to 150 nm. For instance, w may be from 40 to 150 nm or from 60 to 150 nm.

In embodiments of the first alternative, step i may comprise the steps of:
- providing a stack of layers comprising the substrate, the III-V channel layer over the substrate, the III-V barrier layer on the channel layer, the p-doped III-V layer on the III-V barrier layer, a Schottky contact interlayer on the p-doped III-V layer, a hard mask on the Schottky contact interlayer, and a photoresist layer on the hard mask,
- patterning the photoresist layer to a dimension suitable for obtaining the p-doped III-V layer having a first surface area after dry etching the p-doped III-V layer while using the patterned photoresist as a mask,
- dry etching the hard mask, the Schottky contact interlayer, and the p-doped III-V layer while using the patterned photoresist as a mask, thereby forming the doped III-V layer having a first surface area,
- removing the photoresist layer.

In this step, the hard mask is etched to dimensions suitable for obtaining, after dry etching using the hard mask, a Schottky contact interlayer of a surface area larger than the second surface area (and for instance equal to the first surface area), and a p-doped III-V layer that has the first surface area. To form the hard mask at the desired dimension, a layer of hard mask is provided on the Schottky contact interlayer, then a photoresist layer is formed on the hard mask and is patterned by photolithography at the desired dimensions. Next, the hard mask, the Schottky contact interlayer and the p-doped III-V material are etched by using the photoresist pattern as a mask. In embodiments, dry etching the hard mask, the Schottky contact interlayer, and the p-doped III-V layer while using the patterned photoresist as a mask can for instance be performed by first etching a SiN hard mask and a TiN Schottky contact interlayer with a $SF_6/CHF_3$ mixture by reactive ion etching, then by etching a p-GaN layer by using a mixture of $Cl_2$, $BCl_3$—$BCl_3$, and $SF_6$ also by reactive ion etching.

The first alternative may only use one mask for implementing the process.

In some embodiments, the first alternative relates to a process for manufacturing an enhancement-mode high electron mobility transistor, comprising the steps of:
a. Providing a stack of layers comprising a substrate, a III-V channel layer, a III-V barrier layer on the channel layer, a p-doped III-V layer on the III-V barrier layer, a Schottky contact interlayer on the p-doped III-V layer, and a hard mask on the Schottky contact interlayer;
b. Laterally etching part of the Schottky contact interlayer by a wet etch process, thereby forming a Schottky contact interlayer having a reduced surface area and forming a gap between the p-doped III-V layer and the hard mask,
c. Removing the hard mask, and
d. Depositing a metal gate on the Schottky contact interlayer, the metal gate may include a material different from a material forming the Schottky contact interlayer.

In the second alternative, step a comprises the steps of:
i. Providing a stack of layers comprising a substrate, a III-V channel layer over the substrate, a III-V barrier layer on the channel layer, a p-doped III-V layer on the III-V barrier layer, the p-doped III-V layer having a surface area larger than the first surface area, a Schottky contact layer on the p-doped III-V layer, a hard mask layer on the Schottky contact interlayer, and a photoresist layer on the hard mask,
ii. patterning the photoresist layer to a dimension suitable for obtaining a p-doped III-V layer having a first surface area after dry etching the p-doped III-V layer while using the patterned photoresist as a mask,
iii. dry etching the hard mask, the Schottky contact interlayer, and the p-doped III-V layer while using the patterned photoresist as a mask, thereby forming the p-doped III-V layer having a first surface area,
iv. Removing the photoresist,
v. Providing a photoresist on the etched hard mask,
vi. Patterning the photoresist to a dimension suitable for obtaining a Schottky contact interlayer of a second surface area, smaller than the first surface area after etching the Schottky contact interlayer, and leaving a peripheral part of the top surface of the p-doped III-V layer uncovered, while using the patterned photoresist as a mask,
vii. transferring the pattern of the photoresist in the Schottky contact interlayer and stopping on the p-doped III-V layer, thereby forming the Schottky contact interlayer having the second surface area and leaving a peripheral part of the top surface of the p-doped III-V layer uncovered.

Step vii can be performed in several ways. For instance, the pattern of the photoresist can be first transferred to the hard mask by dry etching, then the photoresist can be removed, then the Schottky contact interlayer can be etched by wet etching while using the patterned hard mask as a mask, and stopping on the p-doped III-V layer. As another example, the pattern of the photoresist can be transferred in the hard mask and the Schottky contact interlayer via dry etching, followed removal of the photoresist and removal of the hard mask. The use of a wet etching step may be used in order to limit the damages to the p-doped III-V layer. The wet etching step can be performed as indicated for the first alternative (e.g. by using a combination of APM and SPM if the Schottky contact interlayer is TiN).

This second alternative of the first aspect may include one more masking step but it may permit a separate cleaning step of the Schottky contact interlayer sidewalls, i.e. a cleaning step decoupled from the etching of the Schottky contact interlayer while in the first alternative the etching of the Schottky contact interlayer may simultaneously serve as a cleaning step of the Schottky contact interlayer sidewalls.

In the third alternative, step a comprises the steps of:
i. Providing a stack of layers comprising a substrate, a III-V channel layer over the substrate, a III-V barrier layer on the channel layer, a p-doped III-V layer on the III-V barrier layer, the p-doped III-V layer having a surface area larger than the first surface area, a Schottky contact interlayer on the p-doped III-V layer, a hard mask layer on the Schottky contact interlayer, and a photoresist layer on the hard mask,
ii. patterning the photoresist layer to a dimension suitable for obtaining a Schottky contact interlayer of a second surface area, smaller than a first surface area after etching the Schottky contact interlayer, while using the patterned photoresist as a mask, iii. transferring the pattern of the photoresist in the hard mask and the Schottky contact interlayer, while using the patterned photoresist as a mask and stopping on the p-doped III-V layer, thereby forming the Schottky contact interlayer having the second surface area, iv. Removing the photoresist (if not yet done in step iii), v. Providing a hard mask layer and a photoresist on the etched hard mask, vi. Patterning the photoresist to a dimension suitable for obtaining a p-doped III-V layer of a first surface area, larger than the second surface area after etching the p-doped III-V layer, and leaving a peripheral part of the top surface of the p-doped III-V layer uncovered by the Schottky contact interlayer, while using the patterned photoresist as a mask, vii. dry etching the p-doped III-V layer, while using the patterned photoresist as a mask and stopping on the barrier layer, thereby forming the p-doped III-V layer having the first surface area and leaving a peripheral part of the top surface of the p-doped III-V layer uncovered by the Schottky contact interlayer, and viii. Removing the photoresist and the hard mask.

Step iii of transferring the pattern of the photoresist in the hard mask and the Schottky contact interlayer can be performed in several ways. For instance, the pattern of the photoresist can be first transferred to the hard mask by dry etching, then the photoresist can be removed, then the Schottky contact interlayer can be etched by wet etching while using the patterned hard mask as a mask and stopping on the p-doped III-V layer. As another example, the pattern of the photoresist can be transferred in the hard mask and the Schottky contact interlayer via dry etching, followed removal of the photoresist and removal of the hard mask. The use of a wet etching step may limit the damages to the p-doped III-V layer. The wet etching step can be performed as indicated for the first alternative (e.g. by using a combination of APM and SPM if the Schottky contact interlayer is TiN).

The following embodiments are applicable to any one of the three alternatives described above.

In embodiments, the III-V channel layer may be a GaN layer.

In embodiments, the III-V barrier layer may be an AlGaN layer.

In embodiments, the Schottky contact interlayer may be a TiN interlayer.

In embodiments, the Schottky contact interlayer may have a thickness of from 1 to 50 nm.

In embodiments, the metal gate may be composed of at least two layers differing in their chemical nature.

In embodiments, the metal gate may comprise at least one layer comprising Al, Cu, or an alloy thereof.

In embodiments, the metal gate may comprise a first TiN layer on the Schottky contact interlayer, a Ti layer on the TiN layer, an alloy of Cu and Al on the Ti layer, a Ti layer on the alloy of Cu and Al, and a second TiN layer on the Ti layer.

In embodiments, the second TiN layer may have a thickness of from 10 to 80 nm.

In embodiments, the combined thickness of the Schottky metal interlayer and the first TiN layer may be from 11 to 81 nm.

In embodiments, depositing a metal gate on the Schottky contact interlayer may comprise the steps of:

(i) Depositing a dielectric layer on the Schottky contact interlayer, (ii) Opening part of the dielectric layer to form an opening exposing at least part of the Schottky contact interlayer, and (iii) Depositing the metal gate on the Schottky contact interlayer in the opening.

Step (ii) of opening part of the dielectric layer may be performed in such a way that only part of the Schottky contact interlayer is exposed. Indeed, the metal gate may only be present on the Schottky contact interlayer and not on the p-doped III-V layer.

In embodiments, depositing the dielectric layer on the Schottky contact interlayer may comprise depositing an aluminum oxide layer on the Schottky contact interlayer and depositing a silicon oxide layer on the aluminum oxide layer.

In embodiments, the metal gate may comprise a material different from a material forming the Schottky contact interlayer.

In a second aspect, the present disclosure relates to an enhancement-mode high electron mobility transistor comprising a stack of layers comprising a substrate, a III-V channel layer over the substrate, a III-V barrier layer on the channel layer, a p-doped III-V layer on the III-V barrier layer, the p-doped III-V layer having a first surface area, a Schottky contact interlayer on the p-doped III-V layer, the Schottky contact interlayer having a second surface area, smaller than the first contact area, and leaving a peripheral part of the top surface of the p-doped III-V layer uncovered, and a metal gate on the Schottky contact interlayer.

In embodiments, the transistor may further comprise a dielectric layer on a peripheral part of the Schottky contact interlayer.

In embodiments, the metal gate may comprise a material different from a material forming the Schottky contact interlayer.

Any feature of the second aspect may be as correspondingly described for the first aspect.

The invention will now be described by a detailed description of embodiments. It is clear that other embodiments can be configured without departing from the technical teaching of the disclosure, the invention being limited only by the terms of the appended claims.

Example 1: Manufacture of a Transistor (13) According to an Embodiment of the Present Disclosure In an MOCVD reactor, an AlN layer, an AlGaN buffer layer (2), a GaN channel layer (4), a 12.5 nm $Al_{0.25}GaN$ barrier layer (5), and a 80 nm p-GaN layer (8) were consecutively grown on a <111> Si substrate (1).

After cleaning the back side and the front side, 30 nm of a TiN interlayer (9) were deposited by PVD.

Figure 3:
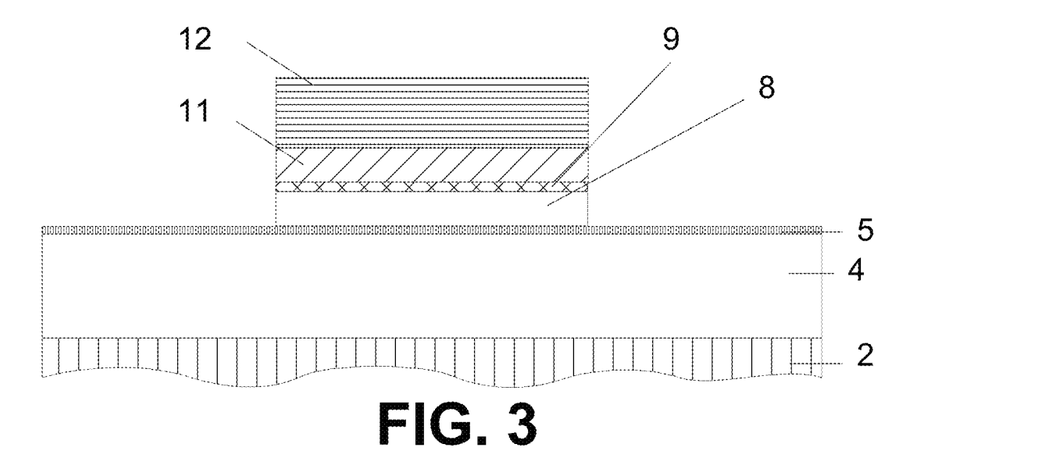
FIG. 3 shows a schematic illustration of an intermediate structure obtained during a process, according to example embodiments.

We now refer to FIG. 3. 100 nm of a SiN hard mask (11) were then deposited on the TiN interlayer (9) by PECVD at 400° C. A photoresist (12) was then deposited on the SiN hard mask (11).

Figure 4:
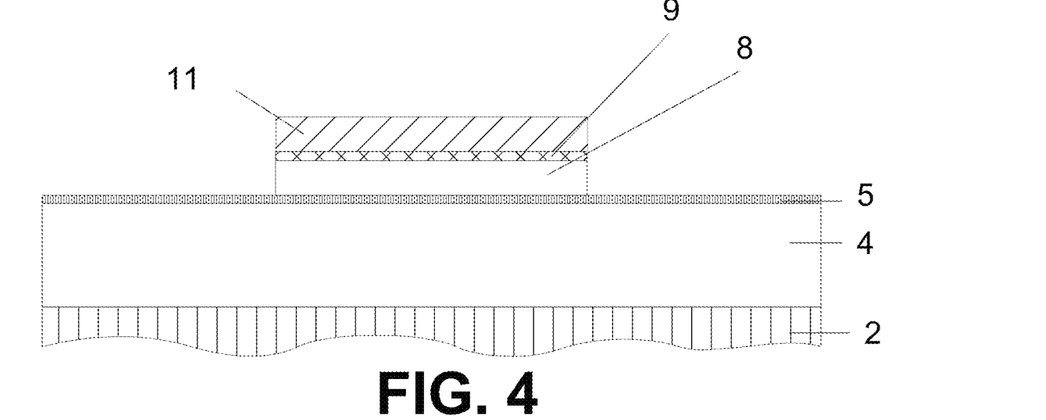
FIG. 4 shows a schematic illustration of an intermediate structure obtained during a process, according to example embodiments.

We now refer to FIG. 4. The SiN hard mask, the TiN layer, and the p-GaN layer were etched by reactive ion etching.

Figure 5:
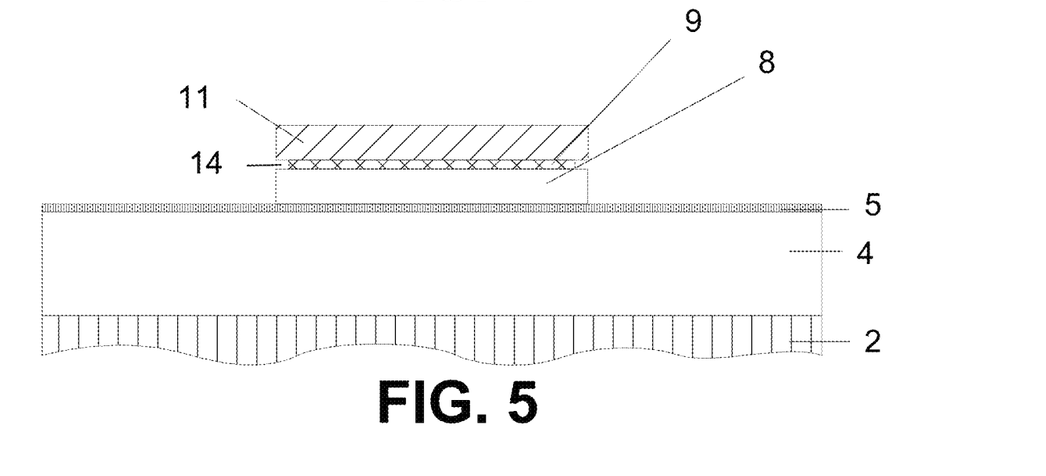
FIG. 5 shows a schematic illustration of an intermediate structure obtained during a process, according to example embodiments.
Figure 12:
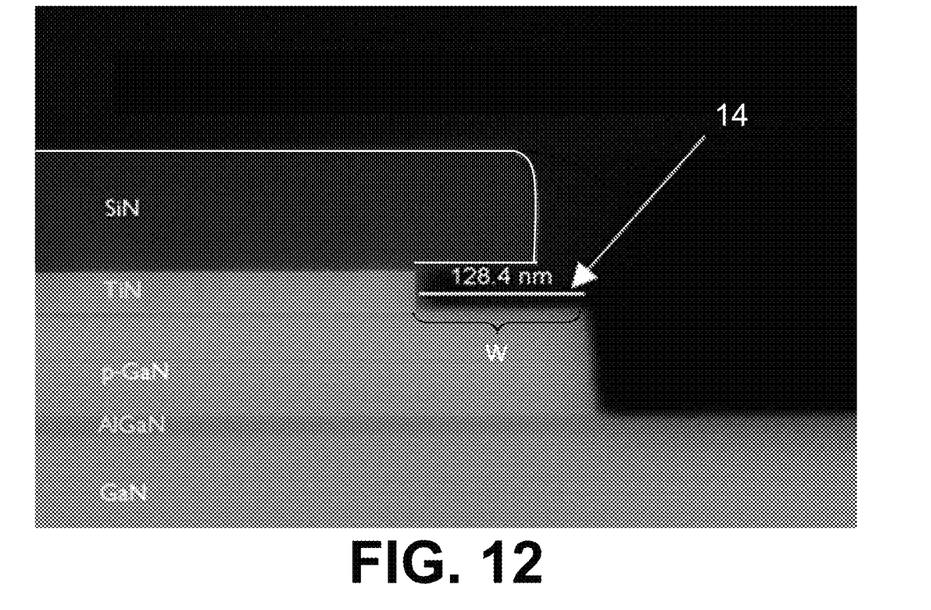
FIG. 12 is a scanning electron microscopy vertical cross-section corresponding to FIG. 5, according to example embodiments.

We now refer to FIG. 5. The resist was stripped. The TiN interlayer was then etched laterally via a 5 minutes SPM (1:10) treatment at 90° C. followed by a 5 minutes APM (1:4:20) treatment at 65° C. This step reduced the surface area of the TiN interlayer by removing 128 nm from each side edge, and formed a gap (14) between the p-GaN layer and the SiN hard mask. FIG. 12 shows a SEM cross-section of the structure obtained at this step. Visible in FIG. 12 is the uncovered peripheral part of width (w) of the top surface of the p-doped III-V layer.

Figure 6:
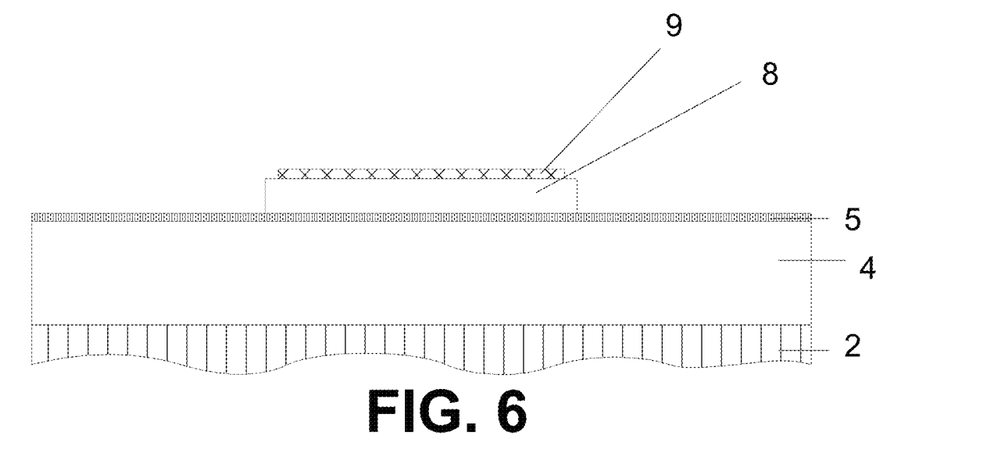
FIG. 6 shows a schematic illustration of an intermediate structure obtained during a process, according to example embodiments.

We now refer to FIG. 6. The SiN hard mask was then removed. Next, the back side and the front side were cleaned from metal contaminations.

Figure 7:
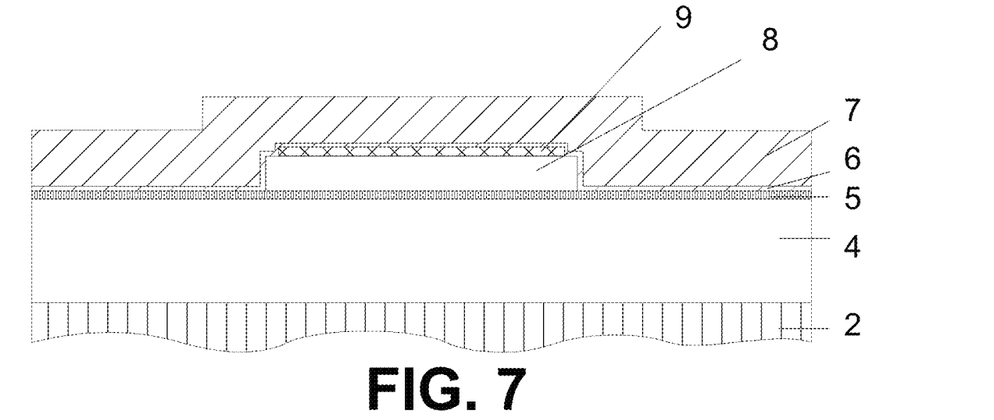
FIG. 7 shows a schematic illustration of an intermediate structure obtained during a process, according to example embodiments.

We now refer to FIG. 7. 2.5 nm of $Al_2O_3$ (6) were then deposited on the p-GaN layer and on the TiN interlayer by ALD at 300° C. Next, 260 nm of $SiO_2$ (7) were deposited by PECVD at 400° C.

Figure 8:
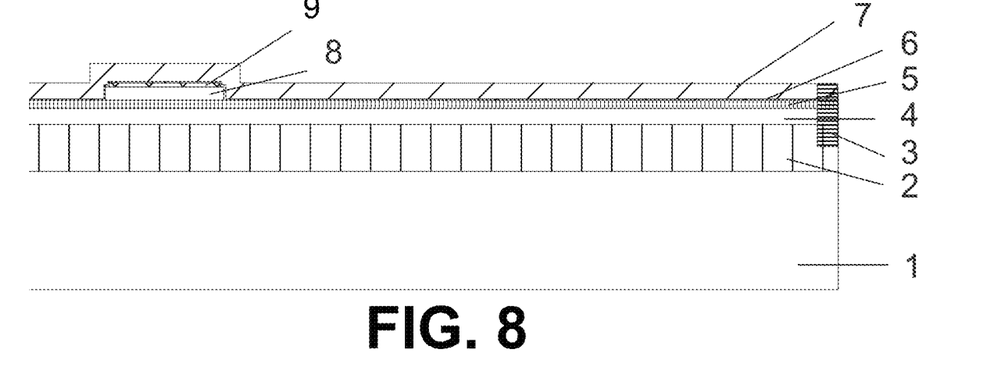
FIG. 8 shows a schematic illustration of an intermediate structure obtained during a process, according to example embodiments.

We now refer to FIG. 8. N-implant isolation (3) was performed by first providing a photoresist, aligned with the p-GaN and covering the same, followed by N implantation through the $SiO_2/Al_2O_3$/p-GaN. The photoresist was then striped.

Figure 9:
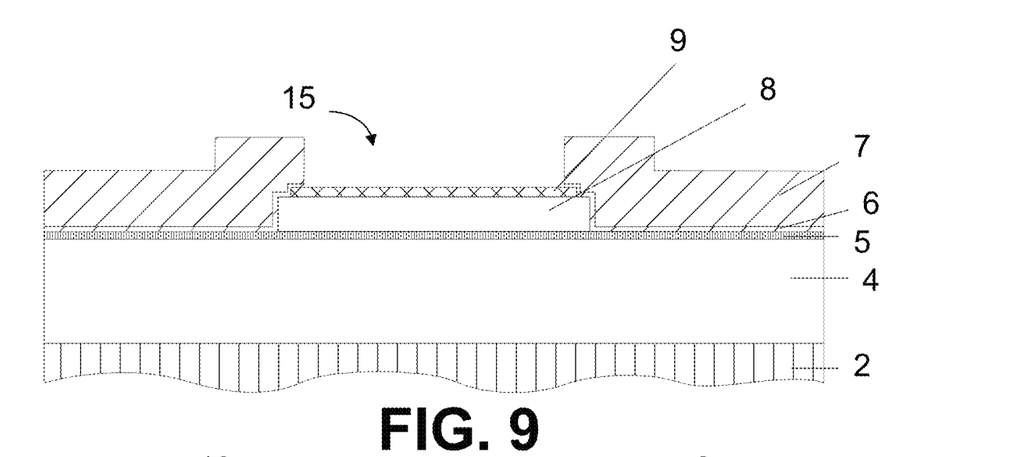
FIG. 9 shows a schematic illustration of an intermediate structure obtained during a process, according to example embodiments.

We now refer to FIG. 9. A photoresist was then provided, aligned with the p-GaN and leaving it uncovered, then the $SiO_2$ and the $Al_2O_3$ were etched, thereby exposing the TiN present on the p-GaN. The resist was then stripped with EKC 265.

Figure 10:
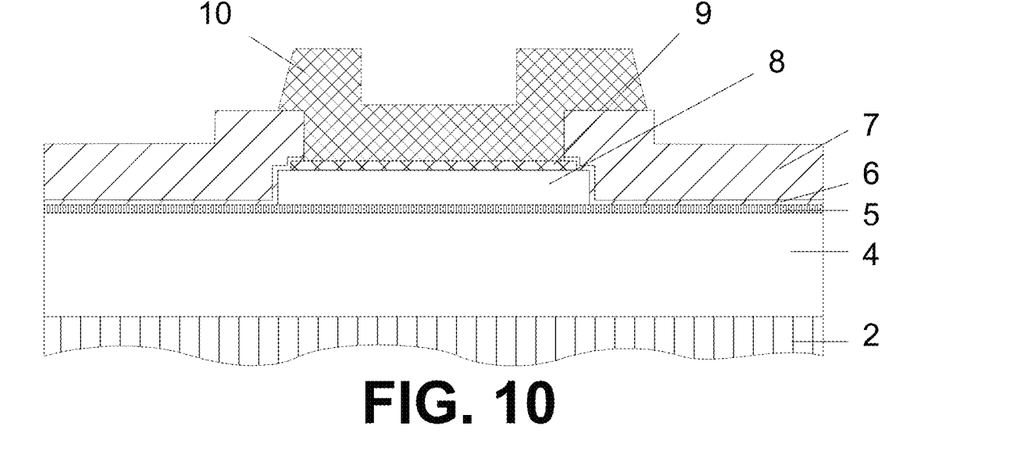
FIG. 10 shows a schematic illustration of an intermediate structure obtained during a process, according to example embodiments.

We now refer to FIG. 10. The back side and the front side were once more cleaned, then 40 nm TiN, 20 nm Ti, 250 nm AlCu, 5 nm Ti, and 30 nm TiN were successively deposited on the TiN, thereby forming the gate metal (10).

Figure 11:
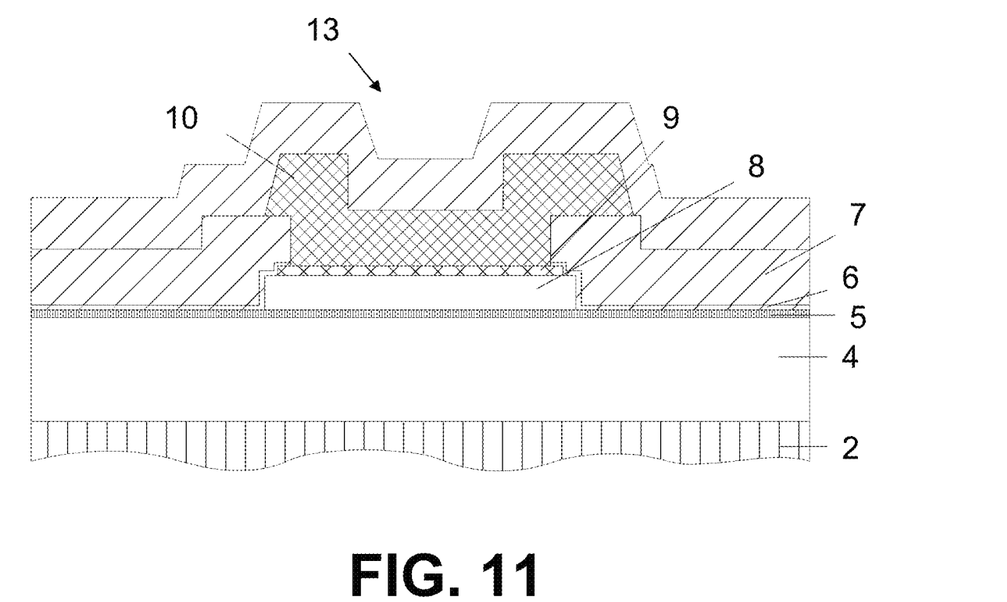
FIG. 11 shows a schematic illustration of an intermediate structure obtained during a process, according to example embodiments.

To complete the device, further steps such as a patterning of the gate metal, the formation of a $SiO_2$ gate cap (see FIG. 11), and the formation of source and drain contacts were performed as is well known in the art.

Example 2

We now refer again to FIG. 5. Example 1 was repeated except that just before etching the TiN interlayer laterally, a TMAH treatment of the side walls of the p-GaN layer was operated. Then, the lateral etching of TiN was performed by a 5 minutes SPM (1:10) treatment at 90° C., followed by a 5 minutes APM (1:4:20) treatment at 65° C.

Figure 1:
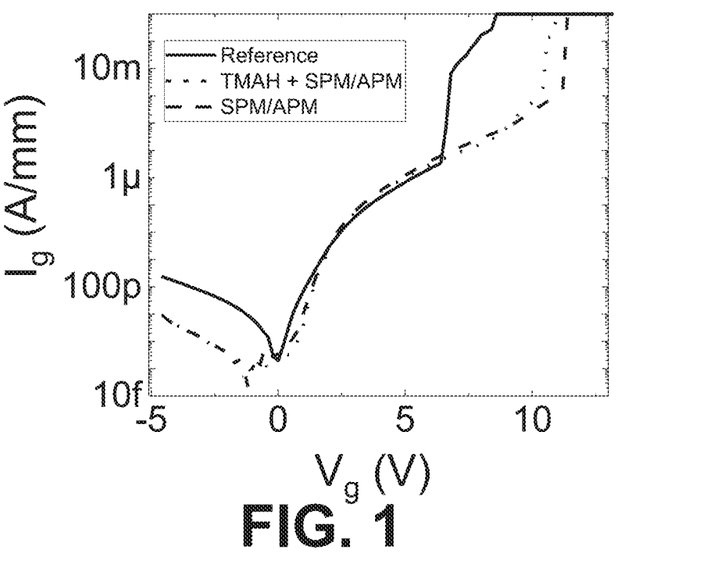
FIG. 1 is a graph showing the forward gate leakage for the prior art and for embodiments of the present disclosure.

FIG. 1 shows the leakage gate current $I_g$ (A/mm) as a function of the gate bias $V_g$ (V). The solid line corresponds to a comparative device constructed as indicated in example 1 except that the TiN interlayer was not etched laterally and hence kept a surface area similar to the surface area of the underlying p-GaN layer. As can be observed, around 6 V, the leakage current increases dramatically. This leakage increase may be attributable to a degradation occurring at the sidewall of the gate. This sudden increase in gate leakage occurs at gate bias values around 6V, i.e. a bias value which is much below the expected breakdown values of the gate. The dotted dashed line corresponds to the device obtained in Example 1 and the dotted line corresponds to the device obtained in Example 2. As can be seen for both examples of the present disclosure, the sudden increase at 6V disappeared.

Figure 2:
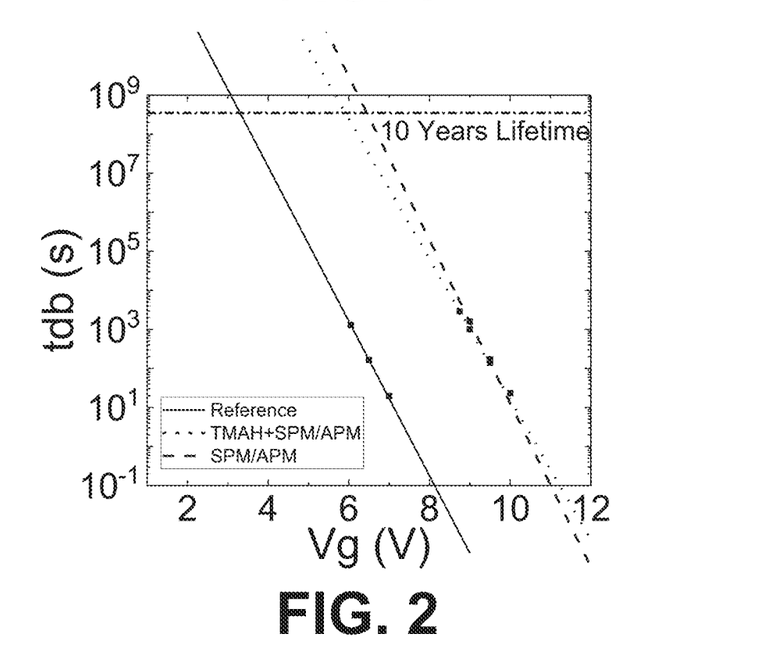
FIG. 2 is a graph comparing the lifetime of the gate obtained through different process conditions for the prior art and for embodiments of the present disclosure.

FIG. 2 shows the voltage loop frequency response (tdb (s)) as a function of the applied gate voltage. The solid line corresponds to the comparative example. The dashed line corresponds to the device obtained in example 1 and the dotted line corresponds to the device obtained in example 2.

It is to be understood that although embodiments, specific constructions and configurations, as well as materials, have been discussed herein for devices according to the present disclosure, various changes or modifications in form and detail may be made without departing from the scope and spirit of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

What is claimed is:

1. A method for manufacturing an enhancement-mode high electron mobility transistor, wherein the method comprises:
   providing a stack of layers comprising:
      a substrate;
      a III-V channel layer over the substrate;
      a III-V barrier layer on the III-V channel layer;
      a p-doped III-V layer on the III-V barrier layer, wherein the p-doped III-V layer has a first surface area; and
      a Schottky contact interlayer on the p-doped III-V layer, wherein the Schottky contact interlayer has a surface that is in contact with the p-doped III-V layer and that has a second surface area, wherein the second surface area is less than the first surface area, and wherein the second surface area leaves a peripheral part of a top surface of the p-doped III-V layer uncovered by the Schottky contact interlayer; and
   depositing a metal gate on the Schottky contact interlayer, thereby forming an interface between the metal gate and the Schottky contact interlayer such that entire interface has a third surface area, wherein the third surface area is less than the second surface area.

2. The method of claim 1, wherein providing the stack of layers comprises:
   providing a stack of layers comprising:
      the substrate;
      the III-V channel layer over the substrate;
      the III-V barrier layer on the III-V channel layer;
      the p-doped III-V layer on the III-V barrier layer;
      the Schottky contact interlayer; and
      a hard mask on the Schottky contact interlayer;
   laterally wet-etching part of the Schottky contact interlayer to form:
      the Schottky contact interlayer having the second surface area; and
      a gap between the p-doped III-V layer and the hard mask; and
   removing at least part of the hard mask to expose at least part of the Schottky contact interlayer.

3. The method of claim 1, wherein the III-V channel layer comprises a GaN layer.

4. The method of claim 1, wherein the III-V barrier layer comprises an AlGaN layer.

5. The method of claim 1, wherein the Schottky contact interlayer comprises a TiN interlayer.

6. The method of claim 1, wherein the Schottky contact interlayer has a thickness between 1 nm and 50 nm.

7. The method of claim 1, wherein the metal gate comprises at least two layers differing in their chemical nature.

8. The method of claim 1, wherein the metal gate comprises at least one layer comprising Al, Cu, or an alloy of Al and Cu.

9. The method of claim 8, wherein the metal gate comprises:
   a first TiN layer on the Schottky contact interlayer;
   a first Ti layer on the first TiN layer;
   an alloy of Cu and Al on the first Ti layer;
   a second Ti layer on the alloy of Cu and Al; and
   a second TiN layer on the second Ti layer.

10. The method of claim 9, wherein the first TiN layer has a thickness between 10 nm and 80 nm.

11. The method of claim 10, wherein a combined thickness of the Schottky contact interlayer and the first TiN layer is between from 11 nm to 81 nm.

12. The method of claim 1, further comprising:
depositing a dielectric layer on the Schottky contact interlayer;
opening part of the dielectric layer to form an opening exposing at least part of the Schottky contact interlayer; and
depositing the metal gate on the Schottky contact interlayer in the opening.

13. The method of claim 12, wherein depositing the dielectric layer on the Schottky contact interlayer comprises:
depositing an aluminum oxide layer on the Schottky contact interlayer; and
depositing a silicon oxide layer on the aluminum oxide layer.

14. The method of claim 1, wherein the metal gate comprises a material different from a material forming the Schottky contact interlayer.

15. An enhancement-mode high electron mobility transistor comprising:
a stack of layers comprising:
a substrate:
a III-V channel layer over the substrate;
a III-V barrier layer on the III-V channel layer;
a p-doped III-V layer on the III-V barrier layer, wherein the p-doped III-V layer has a first surface area;
a Schottky contact interlayer on the p-doped III-V layer, wherein the Schottky contact interlayer has a surface that is in contact with the p-doped III-V layer and that has a second surface area, wherein the second surface area is less than the first surface area, and wherein the second surface area leaves a peripheral part of a top surface of the p-doped III-V layer uncovered by the Schottky contact interlayer; and
a metal gate on the Schottky contact interlayer, wherein an interface exists between the metal gate and the Schottky contact interlayer such that the entire interface has a third surface area, wherein the third surface area is less than the second surface area.

16. The enhancement-mode high electron mobility transistor of claim 15, wherein the III-V channel layer comprises a GaN layer.

17. The enhancement-mode high electron mobility transistor of claim 15, wherein the III-V barrier layer comprises an AlGaN layer.

18. The enhancement-mode high electron mobility transistor of claim 15, wherein the Schottky contact interlayer comprises a TiN interlayer.

19. The enhancement-mode high electron mobility transistor of claim 15, wherein the Schottky contact interlayer has a thickness between 1 nm and 50 nm.

20. The enhancement-mode high electron mobility transistor of claim 15, wherein the metal gate comprises at least two layers differing in their chemical nature.

* * * * *